United States Patent
Kuo et al.

(10) Patent No.: US 12,283,966 B2
(45) Date of Patent: Apr. 22, 2025

(54) SIGMA DELTA ANALOG-TO-DIGITAL CONVERTER AND METHOD FOR ELIMINATING IDLE TONES OF SIGMA DELTA ANALOG-TO-DIGITAL CONVERTER

(71) Applicant: Realtek Semiconductor Corp., HsinChu (TW)

(72) Inventors: Chun-I Kuo, HsinChu (TW); Wen-Tze Chen, HsinChu (TW); Yi-Jang Wu, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 173 days.

(21) Appl. No.: 18/095,512

(22) Filed: Jan. 10, 2023

(65) Prior Publication Data

US 2023/0261662 A1    Aug. 17, 2023

(30) Foreign Application Priority Data

Feb. 11, 2022   (TW) .................................. 111105082

(51) Int. Cl.
*H03M 3/00* (2006.01)
*H03M 1/06* (2006.01)

(52) U.S. Cl.
CPC ................................. *H03M 1/0604* (2013.01)

(58) Field of Classification Search
CPC .. H03M 1/0604; H03M 1/0665; H03M 3/328; H03M 3/338; H03M 3/464

USPC ......................................................... 341/143
See application file for complete search history.

(56) References Cited

U.S. PATENT DOCUMENTS

| | | | | |
|---|---|---|---|---|
| 6,304,608 | B1 * | 10/2001 | Chen ....................... | H03M 3/35 375/252 |
| 7,042,375 | B1 * | 5/2006 | van Engelen ........... | H03M 3/38 341/131 |
| 10,439,634 | B2 * | 10/2019 | Bolatkale ............... | H03M 3/424 |

FOREIGN PATENT DOCUMENTS

| | | |
|---|---|---|
| EP | 2 381 578 A1 | 10/2011 |
| TW | 201338431 A | 9/2013 |

\* cited by examiner

*Primary Examiner* — Jean B Jeanglaude
(74) *Attorney, Agent, or Firm* — Winston Hsu

(57) ABSTRACT

A Sigma Delta analog-to-digital converter (ADC) and a method for eliminating idle tones of the Sigma Delta ADC are provided. The Sigma Delta ADC includes a loop filter, a quantizer, an adder and a digital-to-analog converter (DAC). The loop filter performs filtering on a difference between an analog input signal and an analog feedback signal to generate a filtered signal. The quantizer is coupled to the loop filter, and generates a digital output signal according to the filtered signal. The adder is coupled to the quantizer, and adds a digital dithering signal to the digital output signal to generate a digital feedback signal. The DAC is coupled to the loop filter, and generates the analog feedback signal according to the digital feedback signal.

6 Claims, 2 Drawing Sheets

SIGMA DELTA ANALOG-TO-DIGITAL CONVERTER AND METHOD FOR ELIMINATING IDLE TONES OF SIGMA DELTA ANALOG-TO-DIGITAL CONVERTER

BACKGROUND OF THE INVENTION

1. Field of the Invention

The present invention is related to Sigma Delta analog-to-digital converters (ADCs), and more particularly, to a Sigma Delta ADC and a method for eliminating idle tones of the Sigma Delta ADC.

2. Description of the Prior Art

Sigma Delta analog-to-digital converters (ADCs) typically operate under oversampling. When an input signal is small or equal to zero (e.g., a voltage level of the input signal is kept at a fixed value), an output signal of a Sigma Delta ADC will be periodic with behavior similar to a clock signal. Under operations of oversampling, out-band signals are typically filtered. Thus, under most conditions, single tones introduced by periodicity of the output signal mentioned above will not greatly impact a final output result.

When the input signal is in a specific direct current (DC) level interval, however, the single tones mentioned above will fall in a signal band, making it difficult for the Sigma Delta ADC to output correct values, where the single tones occurring in the signal band due to the above situation can be referred to as "idle tones". As circuits and environment contribute noise, the idle tones will not easily occur in practice. The popularity of Bluetooth headphones has led to increasing requirements for active noise cancellation, however. Under a condition where a specification such as signal-to-noise ratio (SNR) of an ADC becomes more demanding, the possibility of the idle tones occurring increases.

Although the related art provides some solutions regarding the idle tones, these solutions typically need a large amount of measurement results for determining required settings, and parameter variations during a chip manufacturing process will cause challenges for the methods of the related art. Thus, there is a need for a novel method to solve the problem of the related art introducing no or less side effects.

SUMMARY OF THE INVENTION

An objective of the present invention is to provide a Sigma Delta analog-to-digital (ADC) and a method for eliminating idle tones of the Sigma Delta ADC, in order to guarantee that occurrence of idle tones can be prevented in chips manufactured under various conditions.

At least one embodiment of the present invention provides a Sigma Delta ADC, wherein the Sigma Delta ADC may comprise a loop filter, a quantizer, an adder and a digital-to-analog converter (DAC). The loop filter may be configured to perform filtering on a difference between an analog input signal and an analog feedback signal to generate a filtered signal. The quantizer is coupled to the loop filter, and may be configured to generate a digital output signal according to the filtered signal. The adder is coupled to the quantizer, and may be configured to add a digital dithering signal to the digital output signal, to generate a digital feedback signal. The DAC is coupled to the loop filter, and may be configured to generate the analog feedback signal according to the digital feedback signal.

At least one embodiment of the present invention provides a method for eliminating idle tones of a Sigma Delta ADC. The method may comprise: utilizing a loop filter of the Sigma Delta ADC to perform filtering on a difference between an analog input signal and an analog feedback signal to generate a filtered signal; utilizing a quantizer of the Sigma Delta ADC to generate a digital output signal according to the filtered signal; utilizing an adder of the Sigma Delta ADC to add a digital dithering signal to the digital output signal, to generate a digital feedback signal; and utilizing a digital-to-analog converter (DAC) of the Sigma Delta ADC to generate the analog feedback signal according to the digital feedback signal.

The architecture and the method provided by the embodiments of the present invention add a dithering signal into a loop filter in a digital domain, to thereby prevent the occurrence of the idle tones. More particularly, performing signal processing in the digital domain can precisely control energy and frequency domain behaviors of the dithering signal. Thus, the problem caused by adding extra signals (e.g., loop saturation, reduction of a signal dynamic range) can be avoided in an overall system. In addition, the embodiments of the present invention will not greatly increase overall costs. Thus, the present invention can prevent the occurrence of the idle tones without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
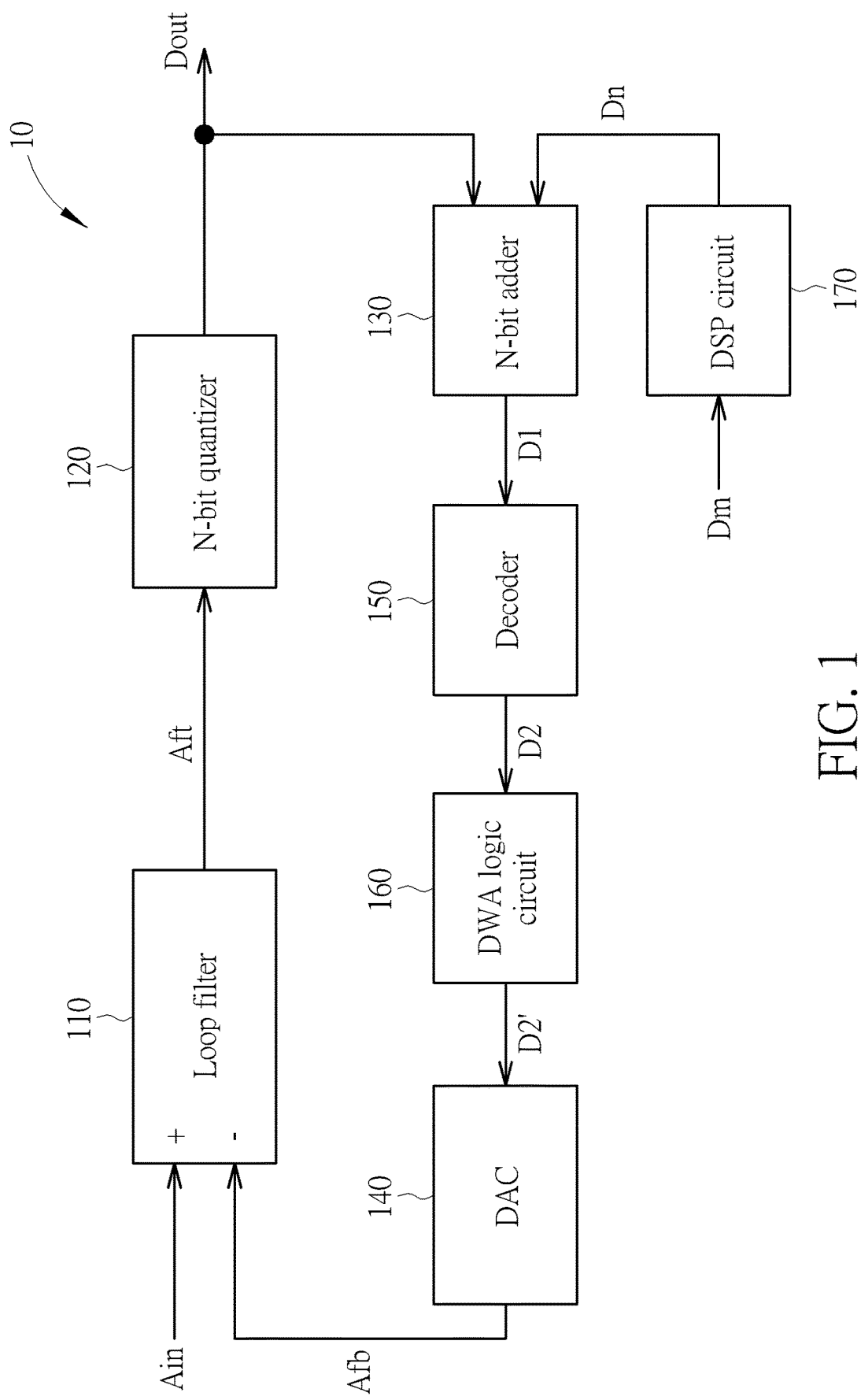
FIG. 1 is a diagram illustrating a Sigma Delta analog-to-digital converter (ADC) according to an embodiment of the present invention.

FIG. 1 is a diagram illustrating a Sigma Delta analog-to-digital converter (ADC) 10 according to an embodiment of the present invention. As shown in FIG. 1, the Sigma Delta ADC 10 may comprise a loop filter 110, a quantizer such as an N-bit quantizer 120, an adder such as an N-bit adder 130, and a digital-to-analog converter (DAC) 140, where N is a positive integer. In this embodiment, N may be a positive integer greater than one, and the Sigma Delta ADC 10 may further comprise a decoder 150 and a data weighted averaging (DWA) logic circuit 160. In some embodiments, N may be equal to one (e.g., utilizing a single-bit quantizer architecture), and the decoder 150 and the DWA logic circuit 160 may be omitted. Idle tones are more likely to occur in high specification (e.g., low noise) architecture, however, where implementation of such architecture typically adopts a multi-bit quantizer, rather than adopting a single-bit quantizer. Furthermore, in comparison with utilizing the multi-bit quantizer, quantization noise generated by utilizing the single-bit quantizer is higher, and is therefore less likely to introduce the idle tones. As the present invention focuses on improving architecture which has a risk of generating the idle tones, embodiments of the present invention illustrate the architecture utilizing the multi-bit quantizer, but the present invention is not limited thereto.

In this embodiment, the loop filter 110 may utilize a first input terminal thereof (which is labeled "+" in FIG. 1 for brevity) to receive an analog input signal Ain, and utilize a second input terminal thereof (which is labeled "−" in FIG. 1 for brevity) to receive an analog feedback signal Afb from the DAC 140, where the loop filter 110 may be configured to perform filtering on a difference between the analog input signal Ain and the analog feedback signal Afb to generate a filtered signal Aft. The N-bit quantizer 120 is coupled to the loop filter 110 in order to receive the filtered signal Aft, and may be configured to generate a digital output signal Dout according to the filtered signal Aft (e.g., outputting a corresponding digital code according to a voltage level of the filtered signal Aft). The N-bit adder 130 is coupled to the N-bit quantizer 120 in order to receive the digital output signal Dout, and may receive a digital dithering signal Dn from a digital signal processing (DSP) circuit 170, and add the digital dithering signal Dn to the digital output signal Dout for generating a digital feedback signal D1 (e.g., D1=Dout+Dn). The DAC 140 is coupled to the loop filter 110, and may be configured to generate the analog feedback signal Afb according to the digital feedback signal D1. Different digital codes may respectively correspond to different feedback charges, currents or voltages, so the DAC 140 may output a corresponding feedback charge, current or voltage according to a digital code of the digital feedback signal D1.

The DAC 140 may comprise a plurality of DAC units (e.g., $2^N$ DAC units). In this embodiment, the decoder 150 may perform a binary-to-thermometer conversion on the digital feedback signal D1, to convert the digital feedback signal D1 indicated by a binary code into a digital feedback signal D2 indicated by a thermometer code. In detail, the digital feedback signal D2 indicated by the thermometer code may comprise $2^N$ bits, where the $2^N$ bits correspond to the $2^N$ DAC units, respectively. For example, the DAC 140 may control the $2^N$ DAC units according to logic values of the $2^N$ bits, respectively. In practice, feedback signals provided by the plurality of DAC units are not exactly identical. In order to prevent mismatch of the DAC units from introducing harmonic tones in a signal band, the DWA logic circuit 160 may perform logic operations on the digital feedback signal D2 to generate a digital feedback signal D2', in order to make power of the harmonic tones introduced by component mismatch be uniformly dispersed over multiple frequencies (e.g., make respective DAC units substantially have the same frequency of usage). Those skilled in this art can understand detailed implementation of the decoder 150 and the DWA logic circuit 160 shown in FIG. 1 according to the above description, and related details are therefore omitted here for brevity.

In the embodiment of FIG. 1, the Sigma Delta ADC 10 operates under oversampling. For example, an operation frequency (e.g., a sampling rate of sampling the analog input signal Ain) of the Sigma Delta ADC 10 is two or more times the bandwidth of the signal band. As shown in FIG. 1, a signal path constituted by the loop filter 110, the N-bit quantizer 120, the N-bit adder 130, the decoder 150, the DWA logic circuit 160 and the DAC 140 forms a negative feedback loop. Under the operations of oversampling and negative feedback, the Sigma Delta ADC 10 may iteratively correct an error between the analog feedback signal Afb and the analog input signal Ain, to convert the analog input signal Ain into the digital output signal Dout. When the analog input signal Ain is extremely small or equal to zero (for example, the analog input signal Ain is fixed at a direct current (DC) voltage level), if the digital dithering signal is zero (e.g., the DSP circuit 170 is temporarily disabled), a value of the digital output signal Dout may be transmitted backwards without any change (i.e., the digital feedback signal D1 is equal to the digital output signal Dout), and the digital output signal Dout under this condition will be periodic. More particularly, when the fixed DC voltage level of the analog input signal Ain falls in a DC interval, the process of negative feedback may be periodic in a longer cycle, thereby generating low frequency tones (e.g., the idle tones mentioned above).

By comparison, when the DSP circuit 170 provides a non-zero digital dithering signal Dn to break a periodicity in the negative feedback (or shift this periodicity to high frequencies such as outside of the signal band), the occurrence of the idle tones in the signal band can be avoided. In order to prevent the digital dithering signal Dn from severely impacting a signal-to-noise ratio (SNR) of the Sigma Delta ADC 10, power of the digital dithering signal Dn in the signal band needs to be properly designed. In this embodiment, the DSP circuit 170 may generate the digital dithering signal Dn according to the dithering data Dm. For example, the dithering data Dm may be M-bit dithering data, and the DSP circuit 170 may process the M-bit dithering data for generating N-bit dithering data to be the digital dithering signal Dn, where M is a positive integer greater than N. In some embodiments, the dithering data Dm may be generated by a random number generator, and the DSP circuit 170 may perform M-bit-to-N-bit conversion on the dithering data Dm and make power of the digital dithering signal Dn in the signal band (which may be regarded as a noise level of the Sigma Delta ADC 10 in the signal band) be less than power of the digital dithering signal Dn outside the signal band (which may be regarded as a noise level of the Sigma Delta ADC 10 outside the signal band) via digital signal processing (e.g., Sigma Delta modulation or high pass filtering).

In some embodiments, the digital dithering signal Dn may comprise an out-band (e.g., out-of-band) tone signal outside the signal band. For example, the dithering data Dm may be a single tone signal with high resolution, where a frequency of this single tone signal is located outside the signal band. The DSP circuit 170 may utilize digital signal processing therein (e.g., Sigma Delta modulation) to suppress the power inside the signal band as much as possible during the M-bit-to-N-bit conversion, to guarantee that the noise level inside the signal band will not be greatly increased due to the digital dithering signal Dn.

As the dithering data Dm and the digital dithering signal Dn are obtained by processing in the digital domain, and the derived total power of the dithering data Dm may be precisely controlled by a higher number of bits (e.g., M bits), the power of the digital dithering signal Dn in respective bands (e.g., a total noise power of an overall system of the Sigma Delta ADC 10) can be precisely controlled, to ensure that the SNR of the Sigma Delta ADC 10 will not be severely impacted by the digital dithering signal Dn.

Figure 2:
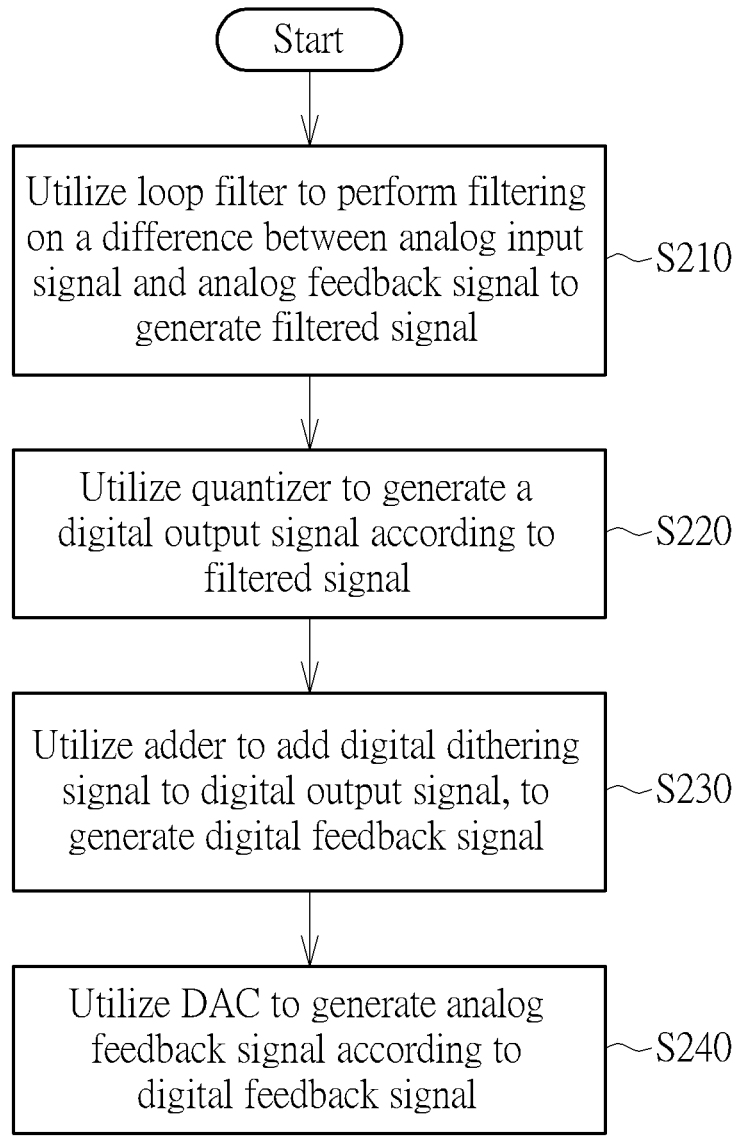
FIG. 2 is a working flow of a method for eliminating idle tones of a Sigma Delta ADC according to an embodiment of the present invention.

FIG. 2 is a working flow of a method for eliminating idle tones of a Sigma Delta ADC (e.g., the Sigma Delta ADC 10 shown in FIG. 1, where the circuit connection and signal transfer relationships mentioned in FIG. 2 may refer to the configuration illustrated in FIG. 1) according to an embodiment of the present invention. It should be noted that the working flow shown in FIG. 2 is for illustrative purposes only, and is not meant to be a limitation of the present invention. If the same result can be obtained, one or more steps may be added, deleted or modified in the working flow, and these steps do not have to be executed in the exact order shown in FIG. 2.

In Step S210, the Sigma Delta ADC may utilize a loop filter therein to perform filtering on a difference between an analog input signal and an analog feedback signal to generate a filtered signal.

In Step S220, the Sigma Delta ADC may utilize a quantizer therein to generate a digital output signal according to the filtered signal.

In Step S230, the Sigma Delta ADC may utilize an adder therein to add a digital dithering signal to the digital output signal, to generate a digital feedback signal.

In Step S240, the Sigma Delta ADC may utilize a DAC therein to generate the analog feedback signal according to the digital feedback signal.

To summarize, the embodiments of the present invention add the dithering signal in the digital domain of the Sigma Delta ADC 10, enabling the control related to the dithering signal to be performed in a digital manner. In comparison with adding a dithering signal in an analog domain of an overall system, such as the input terminal of the loop filter 110 or the input terminal of the N-bit quantizer 120, the embodiments of the present invention do not need to further design a high specification DAC for adding a dithering signal in the analog domain, and the present invention is less likely to sacrifice an input dynamic range of the overall system in order to add the dithering signal. In addition, the embodiments of the present invention can properly operate under various conditions of process variation. Thus, it is not necessary to perform additional modification in response to the process variation. The present invention can prevent the occurrence of the idle tones introducing no or less side effects, thereby solving the problem of the related art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Sigma Delta analog-to-digital converter (ADC), comprising:
   a loop filter, configured to perform filtering on a difference between an analog input signal and an analog feedback signal to generate a filtered signal;
   a quantizer, coupled to the loop filter, configured to generate a digital output signal according to the filtered signal;
   an adder, coupled to the quantizer, configured to add a digital dithering signal to the digital output signal, to generate a digital feedback signal;
   a digital-to-analog converter (DAC), coupled to the loop filter, configured to generate the analog feedback signal according to the digital feedback signal; and
   a digital signal processing circuit, coupled to the adder, configured to process M-bit dithering data for generating N-bit dithering data to be the digital dithering signal, wherein the quantizer is an N-bit quantizer, the adder is an N-bit adder, N is a positive integer, and M is a positive integer greater than N.

2. The Sigma Delta ADC of claim 1, wherein power of the digital dithering signal in a signal band is less than power of the digital dithering signal outside the signal band.

3. The Sigma Delta ADC of claim 1, wherein the digital dithering signal comprises an out-band tone signal outside a signal band of the Sigma Delta ADC.

4. A method for eliminating idle tones of a Sigma Delta analog-to-digital converter (ADC), comprising:
   utilizing a loop filter of the Sigma Delta ADC to perform filtering on a difference between an analog input signal and an analog feedback signal to generate a filtered signal;
   utilizing a quantizer of the Sigma Delta ADC to generate a digital output signal according to the filtered signal;
   utilizing an adder of the Sigma Delta ADC to add a digital dithering signal to the digital output signal, to generate a digital feedback signal;
   utilizing a digital-to-analog converter (DAC) of the Sigma Delta ADC to generate the analog feedback signal according to the digital feedback signal; and
   utilizing a digital signal processing circuit to process M-bit dithering data for generating N-bit dithering data to be the digital dithering signal, wherein the quantizer is an N-bit quantizer, the adder is an N-bit adder, N is a positive integer, and M is a positive integer greater than N.

5. The method of claim 4, wherein power of the digital dithering signal in a signal band is less than power of the digital dithering signal outside the signal band.

6. The method of claim 4, wherein the digital dithering signal comprises an out-band tone signal outside a signal band of the Sigma Delta ADC.

* * * * *